US009177745B2

(12) United States Patent
Lee et al.

(10) Patent No.: US 9,177,745 B2
(45) Date of Patent: Nov. 3, 2015

(54) ORGANIC/INORGANIC COMPOSITE COMPRISING THREE-DIMENSIONAL CARBON NANOTUBE NETWORKS, METHOD FOR PREPARING THE ORGANIC/INORGANIC COMPOSITE AND ELECTRONIC DEVICE USING THE ORGANIC/INORGANIC COMPOSITE

(75) Inventors: Haiwon Lee, Seoul (KR); Tae-Jae Lee, Cheongju-si (KR); Jung-Eun Seo, Incheon (KR)

(73) Assignee: IUCF-HYU (INDUSTRY-UNIVERSITY COOPERATION FOUNDATION HANYANG UNIVERSITY) (KR)

( * ) Notice: Subject to any disclaimer, the term of this patent is extended or adjusted under 35 U.S.C. 154(b) by 391 days.

(21) Appl. No.: 12/999,489
(22) PCT Filed: Jun. 15, 2009
(86) PCT No.: PCT/KR2009/003185
§ 371 (c)(1), (2), (4) Date: Dec. 16, 2010
(87) PCT Pub. No.: WO2009/154379
PCT Pub. Date: Dec. 23, 2009

(65) Prior Publication Data
US 2011/0097631 A1    Apr. 28, 2011

(30) Foreign Application Priority Data

Jun. 19, 2008  (KR) .......................... 10-2008-0057996
Feb. 24, 2009  (KR) .......................... 10-2009-0015436

(51) Int. Cl.
*H01J 1/304*     (2006.01)
*B01J 21/18*     (2006.01)
(Continued)

(52) U.S. Cl.
CPC ............. *H01J 1/304* (2013.01); *B01J 21/185* (2013.01); *B01J 23/881* (2013.01); *B01J 35/002* (2013.01);
(Continued)

(58) Field of Classification Search
CPC .... B01J 21/185; B01J 35/002; B01J 37/0201; B01J 37/0207; B01J 37/08; B01J 37/16; B01J 23/881; B82Y 10/00; B82Y 30/00; B82Y 40/00; C01B 31/0233; C01B 31/0273; C01B 2202/08; H01G 9/20; H01J 1/304; H01J 31/127; H01J 2201/30469; H01J 2329/0455; H01L 51/0048; Y10T 428/24331; Y10T 428/24479; Y02E 10/549
USPC ....................................................... 423/447.3
See application file for complete search history.

(56) References Cited

U.S. PATENT DOCUMENTS 7,189,430 B2      3/2007  Ajayan et al.
2002/0131910 A1*  9/2002  Resasco et al. ............... 422/139
(Continued)

OTHER PUBLICATIONS

Jung, et al., High-Density, Large-Area Single-Walled Nanotube Networks on Nanoscale Patterned Substrates, J. Phys. Chem. B. 2003; 107: 6859-6864.*
(Continued)

*Primary Examiner* — Daniel C McCracken
(74) *Attorney, Agent, or Firm* — Cantor Colburn LLP (57) ABSTRACT

An organic/inorganic composite is provided. The organic/inorganic composite comprises a silicon (Si) substrate formed with nanorods or nanoholes and three-dimensional networks of carbon nanotubes (CNTs) grown horizontally in parallel and suspended between the adjacent nanorods or inside the nanoholes. In the organic/inorganic composite, metal catalysts can be uniformly formed on the nanorods or inside the nanoholes, irrespective of the height of the nanorods or the depth of the nanoholes and the shape and aspect ratio of the nanorods or nanoholes. In addition, the carbon nanotubes grow in a three-dimensional network structure directly over the entire surface of the nanorods or the whole inner surface of the nanoholes and are directly connected to the base electrodes. With this configuration, the three-dimensional carbon nanotube networks are highly dense per unit volume, and the organic/inorganic composite is highly electrically conductive and has a large surface area. Therefore, the use of the organic/inorganic composite enables the fabrication of an electronic device with greatly improved efficiency. Further provided are a method for preparing the organic/inorganic composite and an electronic device fabricated using the organic/inorganic composite.

5 Claims, 9 Drawing Sheets

(51) Int. Cl.
| | |
|---|---|
| *B01J 23/881* | (2006.01) |
| *B01J 35/00* | (2006.01) |
| *B01J 37/02* | (2006.01) |
| *B01J 37/08* | (2006.01) |
| *B01J 37/16* | (2006.01) |
| *B82Y 10/00* | (2011.01) |
| *B82Y 30/00* | (2011.01) |
| *C01B 31/02* | (2006.01) |
| *H01G 9/20* | (2006.01) |
| *H01J 31/12* | (2006.01) |
| *H01L 51/00* | (2006.01) |
| *B82Y 40/00* | (2011.01) |

(52) U.S. Cl.
CPC .......... *B01J 37/0201* (2013.01); *B01J 37/0207* (2013.01); *B01J 37/08* (2013.01); *B01J 37/16* (2013.01); *B82Y 10/00* (2013.01); *B82Y 30/00* (2013.01); *B82Y 40/00* (2013.01); *C01B 31/0233* (2013.01); *C01B 31/0273* (2013.01); *H01G 9/20* (2013.01); *H01J 31/127* (2013.01); *H01L 51/0048* (2013.01); *C01B 2202/08* (2013.01); *H01J 2201/30469* (2013.01); *H01J 2329/0455* (2013.01); *Y02E 10/549* (2013.01); *Y10T 428/24331* (2015.01); *Y10T 428/24479* (2015.01)

(56) References Cited

U.S. PATENT DOCUMENTS

2003/0134739 A1* 7/2003 Cox et al. .......................... 502/4
2004/0192072 A1   9/2004 Snow et al.
2007/0237681 A1  10/2007 Boyle et al.

OTHER PUBLICATIONS

Li, et al., Surface Functionalization of Silicon Nanoparticles Produced by Laser-Driven Pyrolysis of Silane followed by HF-HNO3 Etching, Langmuir 2004; 20: 4720-4727.*

Cassell, et al., Large Scale Synthesis of Single-Walled Carbon Nanotubes, J. Phys. Chem. B 1999; 103: 6484-6492.*

Moisala, et al., The role of metal nanoparticles in the catalytic production of single-walled carbon nanotubes—a review, J. Phys.: Condens. Matter 2003; 15: S3011-S3035.*

International Search Report—PCT/KR2009/003185 dated Feb. 12, 2010.

Written Opinion—PCT/KR2009/003185 dated Feb. 12, 2010.

Yung Joon Jung et al., "High-Density, Large-Area Single-Walled Carbon Nanotube Networks on Nanoscale Patterned Substrates," J. Phys. Chem. B, vol. 107, No. 28, 2003, pp. 6859-6864.

Hiroki Ago et al., "Synthesis of horizontally-aligned single-walled carbon nanotubes with controllabe density on sapphire surface and polarized Raman spectroscopy," Chimical Physics Letters, vol. 421, 2006, pp. 399-403.

Yoshikazu Homma et al., "Growth of suspended carbon nanotube networks on 100-nm-scale silicon pillars," Applied Physics Letters, vol. 81, No. 12, Sep. 16, 2002, pp. 2261-2263.

* cited by examiner

Figure 1

(a) Electrochemical etching (b) Formation of metal catalysts by solution dipping (c) Growth of CNTs

ORGANIC/INORGANIC COMPOSITE COMPRISING THREE-DIMENSIONAL CARBON NANOTUBE NETWORKS, METHOD FOR PREPARING THE ORGANIC/INORGANIC COMPOSITE AND ELECTRONIC DEVICE USING THE ORGANIC/INORGANIC COMPOSITE

TECHNICAL FIELD

The present invention relates to an organic/inorganic composite comprising three-dimensional carbon nanotube (CNT) networks. More specifically, the present invention relates to an organic/inorganic composite with increased surface area and enhanced electron transfer efficiency which comprises uniform high-density three-dimensional carbon nanotube networks, as well as a method for preparing the organic/inorganic composite and an electronic device using the organic/inorganic composite.

BACKGROUND ART

Carbon nanotubes are allotropes of carbon that is one of the most abundant elements on the earth. Carbon nanotubes are tubular structures in which carbon atoms are coupled to each other in a hexagonal honeycomb pattern and have an extremely small diameter in the nanometer range. Such carbon nanotubes exhibit characteristics of metals or semiconductors depending on their diameter and rolled-up shape. Carbon nanotubes are currently being investigated to overcome the limited mechanical and electrical properties of existing materials.

Particularly, single-walled carbon nanotube (SWCNT) bridges suspended between two electrodes or templates or three-dimensional networks thereof can find direct applications in a variety of electronic devices, including field emission displays (FEDs), nanotube interconnectors and nanosensors, due to their excellent electrical properties, such as high current density and ballistic conductance. In view of these advantages, various methods for forming single-walled carbon nanotube bridges and three-dimensional networks thereof have hitherto been proposed.

It is generally known in the art that carbon nanotube networks can be synthesized by selectively forming metal catalyst particles on desired sites of the surface of a silicon (Si) or silica ($SiO_2$) substrate and growing carbon nanotubes in a two- or three-dimensional network on the metal catalyst particles.

Jung et al reported a method for forming single-walled carbon nanotube networks on a silicon or silica substrate patterned with nanoscale pillars by chemical vapor deposition (CVD) using methane as a carbon source (*J. Phys. Chem. B* 2003, 107, 6859-6864). However, there is a difficulty in directly applying the method to the fabrication of an electronic device because the silica substrate is made of non-conductive silica. A metal catalyst used is rendered inactive when the silicon substrate is used, leading to a marked decrease in the density of the networks. The vapor deposition technique, by which Fe or Co as the metal catalyst is deposited on the pillars to form thin films, involves two processing steps of inclining the patterned substrate right and left to deposit the metal catalyst on the upper and side surfaces of the nanoscale pillars, inevitably resulting in poor processing efficiency. Further, a high aspect ratio of the pillars makes it difficult for the catalyst to be uniformly deposited on the lower end portions of the pillars, thus leading to a low density of the carbon nanotubes.

U.S. Pat. No. 7,189,430 discloses a method for forming carbon nanotube networks without involving any additional catalyst deposition step. According to this method, oxide template structures are covered with a gold (Au) masking material and a mixture of xylene as a carbon source and ferrocene as a catalyst is directly used. However, the use of the masking material brings about a reduction in processing efficiency, and continuous supply of iron (Fe) present in the ferrocene increases the Fe concentration of the carbon nanotubes, eventually resulting in a decrease in the purity of the carbon nanotubes.

On the other hand, a technique is known in which catalyst particles are formed on nanoscale pillars by dipping and then carbon nanotube networks are formed using the catalyst particles. However, this technique has a problem in that the catalyst particles may aggregate or a large amount of the catalyst particles may be separated off from the pillars during subsequent cleaning, resulting in a decrease in the density of the carbon nanotube networks.

DISCLOSURE

Technical Problem

In view of the foregoing and other problems, it is a first object of the present invention to provide an organic/inorganic composite comprising three-dimensional carbon nanotube networks that can be directly applied to an electronic device because the carbon nanotubes are directly formed on a silicon substrate and that can achieve enhanced electron transfer efficiency because the three-dimensional carbon nanotube networks are formed in high density on nanorods having a high aspect ratio or inside nanoholes having a high aspect ratio.

A second object of the present invention is to provide a method for preparing the organic/inorganic composite.

A third object of the present invention is to provide an electronic device using the organic/inorganic composite.

Technical Solution

To accomplish the first object of the present invention, there is provided an organic/inorganic composite comprising a silicon (Si) substrate formed with nanorods or nanoholes and three-dimensional networks of carbon nanotubes (CNTs) grown horizontally in parallel and suspended between the adjacent nanorods or inside the nanoholes.

In an embodiment, the number of the three-dimensional carbon nanotube networks per unit volume may be at least 1.5 $\mu m^3$.

In a preferred embodiment, the number of carbon nanotube bridges formed between the two adjacent nanorods per unit height of the nanorods or inside the nanoholes per unit depth of the nanoholes is at least 3/$\mu m$.

To accomplish the second object of the present invention, there is provided a method for preparing an organic/inorganic composite, comprising: (a) preparing a Fe—Mo catalyst solution; (b) treating a silicon (Si) substrate formed with nanorods or nanoholes with piranha solution, UV-ozone or oxygen plasma to modify the surface of the Si substrate into Si—OH; (c) dipping the surface-modified substrate in the catalyst solution to adsorb the metal catalysts on the substrate; and (d) supplying a carbon source gas to the substrate adsorbed by the catalysts to produce carbon nanotubes in a three-dimensional network structure.

In an embodiment, the Fe—Mo catalyst solution may contain $Fe(NO_3)_3 \cdot 9H_2O$ and an aqueous solution of molybdenum (Mo).

In a preferred embodiment, the molar concentration ratio of Fe to Mo in the Fe—Mo catalyst solution is between 5:1 and 0.5:1.

In an embodiment, sonication may be performed in the dipping step.

In an embodiment, the method may further comprise, after step (c), annealing the substrate adsorbed by the catalysts and supplying ammonia ($NH_3$) or hydrogen ($H_2$) gas to the annealed substrate to reduce the metal catalysts.

In an embodiment, the carbon source gas may be selected from the group consisting of methane, ethylene, acetylene, benzene, hexane, ethanol, methanol, propanol gases, and mixed gases thereof.

In a preferred embodiment, the nanorods have a height of 2 to 200 μm and an aspect ratio of 2 to 100 and are spaced apart from each other at intervals of 50 to 2,000 nm.

In an embodiment, the nanoholes may have a height of 2 to 200 μm and an aspect ratio of 2 to 100 and may be spaced apart from each other at intervals of 50 to 2,000 nm.

In an embodiment, at least ten carbon nanotube bridges may be connected between the two adjacent nanorods or are formed horizontally inside the nanoholes to form three-dimensional networks of the carbon nanotubes.

To accomplish the third object of the present invention, there is provided an electronic device that is fabricated using the organic/inorganic composite.

In a preferred embodiment, the electronic device may be selected from the group consisting of electron emission sources, field emission displays (FEDs), light-emitting devices, light-receiving devices, solar cells, fuel cells and sensors.

In an embodiment, the carbon nanotubes may be single-walled carbon nanotubes.

Advantageous Effects

In the organic/inorganic composite of the present invention, the metal catalysts can be uniformly formed on the nanorods or inside the nanoholes, irrespective of the height of the nanorods or the depth of the nanoholes and the shape and aspect ratio of the nanoholes or nanoholes. In addition, the carbon nanotubes grow in a three-dimensional network structure directly over the entire surface of the nanorods or the whole inner surface of the nanoholes and are directly connected to the base electrodes. With this configuration, the three-dimensional carbon nanotube networks are highly dense per unit volume, and the organic/inorganic composite is highly electrically conductive and has a large surface area. Therefore, the use of the organic/inorganic composite according to the present invention enables the fabrication of an electronic device with greatly improved efficiency.

Best Mode

Exemplary embodiments of the present invention will now be described in greater detail with reference to the accompanying drawings.

The present invention provides an organic/inorganic composite which comprises a silicon (Si) substrate formed with nanorods or nanoholes and three-dimensional networks of carbon nanotubes grown horizontally in parallel and suspended between the adjacent nanorods or inside the nanoholes. The organic/inorganic composite of the present invention is characterized in that the number of the three-dimensional carbon nanotube networks per unit volume is at least $1.5/\mu m^3$ and the number of carbon nanotube bridges formed between the two adjacent nanorods per unit height of the nanorods or inside the nanoholes per unit depth of the nanoholes is at least $3/\mu m$. That is, the carbon nanotubes are highly densely formed per unit volume in the organic/inorganic composite and are directly connected to the conductive substrate at ends thereof, resulting in improved conductivity of the organic/inorganic composite. Therefore, the organic/inorganic composite can be directly applied to a variety of electronic devices.

The present invention also provides a method for preparing an organic/inorganic composite, which comprises: (a) preparing a Fe—Mo catalyst solution; (b) treating a Si substrate formed with nanorods or nanoholes with piranha solution, UV-ozone or oxygen plasma to modify the surface of the Si substrate into Si—OH; (c) dipping the surface-modified substrate in the catalyst solution to adsorb the metal catalysts on the substrate; and (d) supplying a carbon source gas to the substrate adsorbed by the catalysts to produce carbon nanotubes in a three-dimensional network structure. The method of the present invention is characterized in that the three-dimensional carbon nanotube networks can be uniformly formed in high density over the entire surface of the nanorods or the whole inner surface of the nanoholes.

The intervals between the adjacent nanorods or nanoholes may be in the range of 10 nm to several tens of μm, but are not limited to this range. When the adjacent nanoholes are spaced apart from each other at intervals of several tens of nm, portions of the substrate defined by the adjacent nanoholes become nanorods in shape.

Figure 1:
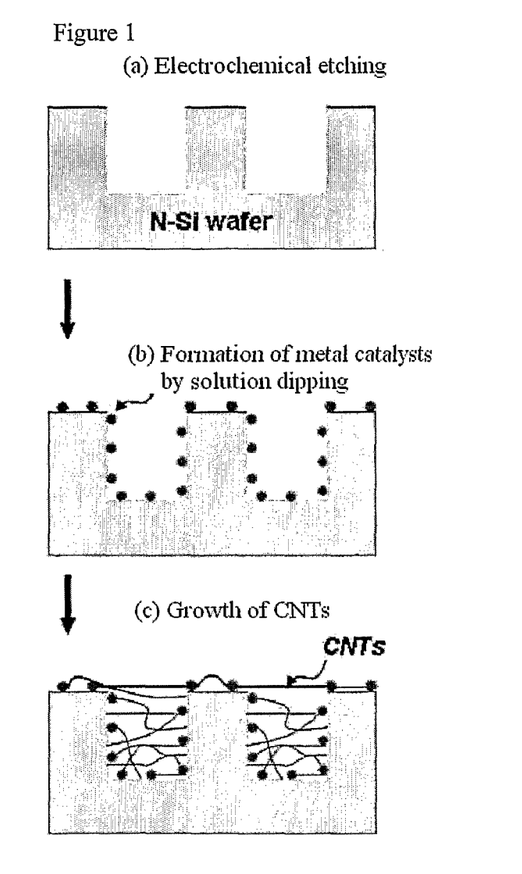
FIG. 1 illustrates schematic diagrams for explaining a method for preparing an organic/inorganic composite according to an embodiment of the present invention.
Figure 2:
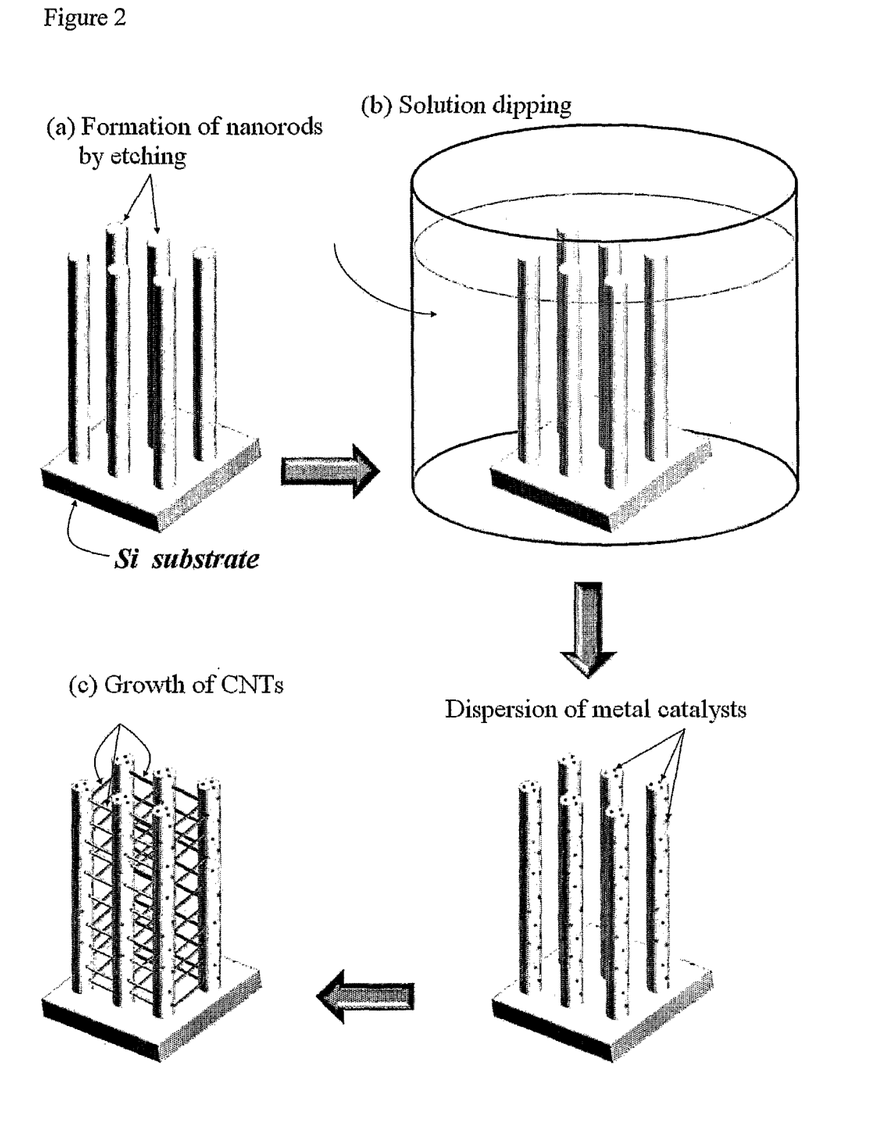
FIG. 2 illustrates schematic diagrams for explaining a method for preparing an organic/inorganic composite according to another embodiment of the present invention.

FIGS. 1 and 2 schematically illustrate two embodiments of the method for preparing an organic/inorganic composite according to the present invention. Referring first to FIG. 1, an organic/inorganic composite may be prepared by (a) etching a silicon substrate to form a three-dimensional structure having nanoholes, (b) introducing metal catalyst particles on the etched substrate by solution dipping, and (c) supplying a carbon source gas to the substrate, on which the metal catalyst particles are introduced, to produce carbon nanotubes in a three-dimensional network bridge structure. Referring next to FIG. 2, an organic/inorganic composite may be prepared by (a) etching a silicon substrate to form a three-dimensional structure having nanorods, (b) introducing metal catalyst particles on the etched substrate by solution dipping, and (c) supplying a carbon source gas to the substrate, on which the metal catalyst particles are introduced, to produce carbon nanotubes in a three-dimensional network bridge structure. The silicon substrate can be etched by any suitable process known in the art. For example, the Bosch process may be used to etch the silicon substrate. A direct growth process may also be used in which a catalyst is formed on the Si substrate and a Si source is supplied to grow Si nanorods directly on the Si substrate.

When it is intended to produce carbon nanotubes by CVD using a metal catalyst, there is a limitation that a substrate, where the carbon nanotubes are to grow, should not be sintered together with the metal catalyst when heat is applied to grow the carbon nanotubes. For example, a silicon substrate is sintered together with Fe as a metal catalyst to form $Fe_xSi_y$ during growth of carbon nanotubes. That is, the catalyst loses its catalytic activity for the growth of the carbon nanotubes, resulting in a decrease in the density of the grown carbon nanotubes. For these reasons, the prior art uses silica ($SiO_2$) substrates rather than silicon substrates. The surface of silica nanorods or nanoholes formed after etching is not electrically conductive because the silica per se is a nonconductor. In contrast, despite the use of the silicon substrate in the method of the present invention, the catalysts are protected from inactivation to grow three-dimensional networks of carbon nanotubes in high density even at the lowest portions of the nanorods or the nanoholes. The nanorods act as base electrodes. Since the carbon nanotubes are directly connected to the base electrodes, high conductivity of the organic/inorganic composite is achieved.

It is believed that the reason why the Fe particles can be prevented from sintering despite the use of the silicon substrate is because the Mo acts as a barrier to the sintering. The composition of the Fe—Mo catalyst solution is not particularly limited. In an embodiment, the Fe—Mo catalyst solution may contain $Fe(NO_3)_3 \cdot 9H_2O$ and an aqueous solution of molybdenum (Mo).

The nanorods or nanoholes of the silicon substrate can be formed by any suitable method commonly used in the art, such as electrochemical etching, photolithography or direct synthesis.

There is no particular restriction on the height of the nanorods, the depth of the nanoholes, and the shape and intervals of the nanorods or the nanoholes. In order to form three-dimensional networks of carbon nanotubes, it is preferred that the nanorods and the nanoholes have the following dimensions and arrangement: height=2-200 μm, intervals=50-2,000 nm, aspect ratio=2-100 as for the nanorods; and depth=2-200 μm, intervals=50-2,000 nm, aspect ratio=2-100 as for the nanoholes. If the nanorods are not higher than 2 μm or the nanoholes are not deeper than 2 μm, the spaces defined by the nanorods or the nanoholes are too narrow to produce carbon nanotubes in a three-dimensional network structure. Meanwhile, if the nanorods are higher 200 μm or the nanoholes are deeper than 200 μm, there is the risk that carbon nanotubes may not be uniformly formed at the lower portions of the nanorods or nanoholes. If the adjacent nanorods or nanoholes are spaced apart from each other at intervals of less than 50 nm, they are too close to each other to produce carbon nanotubes. If the adjacent nanorods or nanoholes are spaced apart from each other at intervals of more than 2,000 nm, there is the risk that carbon nanotube bridge networks may be difficult to form. There is a need to limit the aspect ratio of the nanorods in order to increase the number of three-dimensional carbon nanotube networks per unit space. If the nanorods have an aspect ratio lower than 2 or higher than 100, there is the risk that the density of carbon nanotubes may decrease.

Thereafter, the patterned silicon substrate is cleaned with suitable solvents, such as acetone, ethanol and deionized water, and is treated with piranha solution, UV-ozone or oxygen plasma to modify the surface of the Si substrate into Si—OH. The —OH groups interact with the metal catalysts or the catalyst ions to prevent the metal catalysts from being separated from the surface of the nanorods or nanoholes in the subsequent cleaning step. The piranha solution is a mixture of sulfuric acid and hydrogen peroxide.

The molar concentration ratio of Fe to Mo in the Fe—Mo catalyst solution is between 5:1 and 0.5:1. If the Mo concentration is less than the lower limit, Fe is sintered to lose its activity, resulting in a decrease in the density of carbon nanotubes. Meanwhile, if the Mo concentration is greater than the upper limit, the Mo cannot function as a seed for the growth of carbon nanotubes, there is the risk that the density of the carbon nanotubes may decrease.

In an alternative embodiment, the Fe—Mo catalyst solution may be a mixture of an ethanolic solution of $Fe(NO_3)_3 \cdot 9H_2O$ and an aqueous solution of molybdenum (Mo). In this embodiment, sonication may be performed in a state in which the surface-modified Si substrate is dipped in the catalyst solution. This sonication permits uniform adsorption of the metal catalysts on the Si substrate.

The method of the present invention may further comprise annealing the substrate adsorbed by the metal catalysts in a reactor and feeding $NH_3$ or $H_2$ gas into the reactor to reduce the metal catalysts. The annealing is conducted under vacuum or an atmosphere containing oxygen. Typically, the annealing may be conducted at about 300 to about 500° C. for about 10 to about 60 min. The reason for the annealing is to remove organic/inorganic chemical substances attached to the metal catalysts and the substrate and to oxidize the surface of the catalyst particles. This oxidization inhibits the metal catalysts from migrating at high temperatures and prevents the metal catalysts from aggregation. The metal catalysts are not sufficiently annealed at a temperature lower than 300° C., while excessive thermal energy is created at a temperature higher than 500° C. to activate the thermal motion of the metal catalysts, posing the risk that the metal catalysts may aggregate. The oxygen-containing atmosphere for annealing is advantageous in removing organic chemical substances but increases the risk that the surface of the silicon substrate may be oxidized. Despite this risk, short annealing time minimizes the amount of the silicon oxidized to a negligible level.

As a result of the annealing, the metal catalysts are oxidized on the substrate surface. $H_2$ or $NH_3$ gas is fed into the reactor to reduce the metal catalyst oxides. Specifically, after the annealing, the reactor is heated to about 700 to about 900° C. while reducing the internal pressure to about $10^{-2}$ torr or lower. For example, $H_2$ or $NH_3$ gas can be fed into the reactor when the reactor is stabilized at about 800° C. Alternatively, the gas may be fed into the reactor while increasing the reactor temperature. The internal pressure and temperature of the reactor are not limited to the ranges defined above.

After the metal catalysts are reduced, a carbon source gas is fed into the reactor to produce carbon nanotubes. Any suitable carbon source gas may be used without any limitation. For example, the carbon source gas can be selected from the group consisting of methane, ethylene, acetylene, benzene, hexane, ethanol, methanol, propanol gases, and mixed gases thereof.

The carbon nanotubes are typically single-walled carbon nanotubes, but are not limited thereto. For example, the carbon nanotubes may be multi-walled carbon nanotubes. Multi-walled carbon nanotubes are advantageous because of their conductivity higher than that of single-walled carbon nanotubes.

The number of the carbon nanotube bridges connected between the two adjacent nanorods of the organic/inorganic composite is preferably at least 10. As the number of the carbon nanotubes per unit space increases, the electrical conductivity and surface area of the organic/inorganic composite increase. Therefore, the use of the organic/inorganic composite enables the fabrication of an electronic device with improved efficiency.

No particular limitation is imposed on the kind of the electronic device. For example, the electronic device can be selected from the group consisting of electron emission sources, field emission displays (FEDs), light-emitting devices, light-receiving devices, solar cells, fuel cells and sensors.

Figure 3:
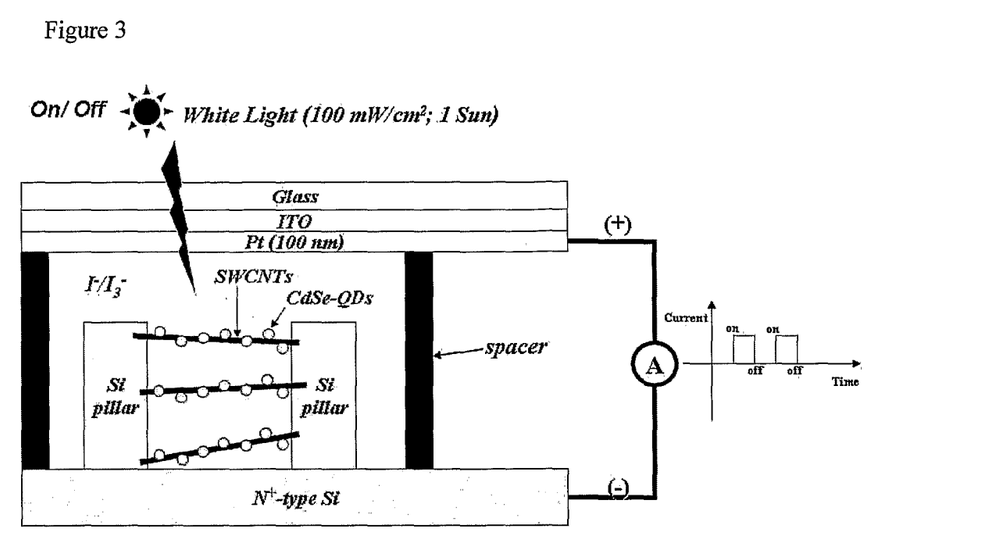
FIG. 3 illustrates a schematic diagram of a solar cell according to an embodiment of the present invention.

FIG. 3 illustrates a schematic diagram of a solar cell fabricated using the organic/inorganic composite in accordance with an embodiment of the present invention. The solar cell is a kind of dye-sensitized solar cell. The solar cell comprises an n-type silicon substrate disposed at the bottom thereof. The three-dimensional carbon nanotube networks of the organic/inorganic composite according to the present invention are formed on the silicon substrate and CdSe quantum dots as inorganic compounds are adsorbed on the three-dimensional carbon nanotube networks. $I^-/I_3^-$ is used as an electrolyte. The $I^-$ plays a role in providing electrons to the CdSe molecules and the $I_3^-$, which is an oxidized form of $I^-$, receives the electrons arrived at a counter electrode and is again reduced to $I^-$. Spacers are disposed at right and left sides of the electrolyte layer. A platinum (Pt) electrode and ITO glass are sequentially disposed on the electrolyte layer.

Mode for Invention

Hereinafter, the present invention will be explained in more detail with reference to the following examples. However, these examples are not intended to limit the present invention.

EXAMPLES

Example 1

An n-type Si wafer was etched by common photolithography and the Bosch process to form nanorods having a height of 2 μm and a diameter of about 1 μm. The nanorods were spaced apart from each other at intervals of 1 μm. Then, the etched Si wafer was cleaned with acetone, ethanol and deionized water, treated with piranha solution for 30 min to modify the surface of the Si wafer into Si—OH, and cleaned with deionized water. An ethanolic solution of $Fe(NO_3)_3 \cdot 9H_2O$ (Junsei, Japan) was mixed with an aqueous solution of molybdenum (ICP/DCP standard solution, 10,000 μg/mL Mo in $H_2O$, Aldrich) to prepare a catalyst solution. The molar concentration ratio of Fe to Mo in the catalyst solution was adjusted to 4:1. The surface-modified Si wafer was dipped in the catalyst solution to uniformly adsorb the catalysts over the entire surfaces of the wafer and the nanorods, cleaned with ethanol, and mounted in a horizontal quartz tube reactor. The Si wafer adsorbed by the catalysts was annealed in air at 400° C. for 30 min. The reactor was heated to 800° C. while maintaining the internal pressure at $1.0 \times 10^{-2}$ Torr or less. Then, the reactor was stabilized at a temperature of 800° C. $NH_3$ gas was fed into the reactor at 300 sccm for 10 min to reduce the metal oxide catalysts to their pure metals. $C_2H_2$ as a carbon source gas was fed into the reactor at 20 sccm for 10 min to form three-dimensional networks of single-walled carbon nanotubes. At that time, the internal pressure of the reactor was maintained at $3.3 \times 10^{-1}$ Torr.

Example 2

Three-dimensional networks of single-walled carbon nanotubes were formed in the same manner as in Example 1, except that the nanorods had a height of 5 μm and a diameter of about 0.75 μm and were spaced apart from each other at intervals of 1.25 μm.

Example 3

Three-dimensional networks of single-walled carbon nanotubes were formed in the same manner as in Example 1, except that the nanorods had a height of 7 μm and a diameter of about 1.3 μm and were spaced apart from each other at intervals of 1.3 μm.

Example 4

An n-type Si wafer was dipped in a mixed solvent of HF and ethanol, followed by electrochemical etching to form nanoholes having a depth of 40 μm and a diameter of about 200-1,000 nm. Then, the etched Si wafer was cleaned with acetone, ethanol and deionized water, treated with piranha solution for 30 min to modify the surface of the Si wafer into Si—OH, and cleaned with deionized water. An ethanolic solution of $Fe(NO_3)_3 \cdot 9H_2O$ (Junsei, Japan) was mixed with an aqueous solution of molybdenum (ICP/DCP standard solution, 10,000 μg/mL Mo in $H_2O$, Aldrich) to prepare a catalyst solution. The molar concentration ratio of Fe to Mo in the catalyst solution was adjusted to 5:1. The surface-modified Si wafer was dipped in the catalyst solution, followed by sonication to uniformly adsorb the catalysts over the entire surfaces of the wafer and the nanoholes, cleaned with ethanol, and mounted in a horizontal quartz tube reactor. The Si wafer adsorbed by the catalysts was annealed in air at 400° C. for 30 min. The reactor was heated to 800° C. while maintaining the internal pressure at $1.0 \times 10^{-2}$ Torr or less. Then, the reactor was stabilized at a temperature of 800° C. $NH_3$ gas was fed into the reactor at 300 sccm for 10 min to reduce the metal oxide catalysts to their pure metals. $C_2H_2$ as a carbon source gas was fed into the reactor at 20 sccm for 10 min to form three-dimensional networks of single-walled carbon nanotubes. At that time, the internal pressure of the reactor was maintained at $3.3 \times 10^{-1}$ Torr.

Comparative Example 1

An n-type Si wafer was etched by common photolithography and the Bosch process to form nanorods having a height of 2 μm and a diameter of about 1 μm. The nanorods were spaced apart from each other at intervals of 1 μm. Then, the etched Si wafer was cleaned with acetone, ethanol and deionized water, treated with piranha solution for 30 min to modify the surface of the Si wafer into Si—OH groups, and cleaned with deionized water. An aqueous solution of cobalt (ICP/DCP standard solution, 9,923 PPM of Co in 0.6 wt. % $HNO_3$, Aldrich) was mixed with an aqueous solution of molybdenum (ICP/DCP standard solution, 10,000 μg/mL Mo in $H_2O$, Aldrich) to prepare a catalyst solution. The molar concentration ratio of Co to Mo in the catalyst solution was adjusted to 4:1. The surface-modified Si wafer was dipped in the catalyst solution to uniformly adsorb the catalysts over the entire surfaces of the wafer and the nanorods, cleaned with ethanol, and mounted in a horizontal quartz tube reactor. The Si wafer adsorbed by the catalysts was annealed in air at 400° C. for 30 min. The reactor was heated to 800° C. while maintaining the internal pressure at $1.0 \times 10^{-2}$ Torr or less. Then, the reactor was stabilized at a temperature of 800° C. $NH_3$ gas was fed into the reactor at 300 sccm for 10 min to reduce the metal oxide catalysts to their pure metals. $C_2H_2$ as a carbon source gas was fed into the reactor at 20 sccm for 10 min to form three-dimensional networks of single-walled carbon nanotubes. At that time, the internal pressure of the reactor was maintained at $3.3 \times 10^{-1}$ Torr.

Comparative Example 2

Carbon nanotube networks were formed in the same manner as in Comparative Example 1, except that $(C_2H_3O_2)_2Co$ (Aldrich) was used instead of the aqueous solution of cobalt.

Example 5

5-(1): Surface Modification of Carbon Nanotubes

Each of the silicon electrodes produced in Examples 1-3, on which the three-dimensional carbon nanotube networks were formed, was dipped in a solution of 0.01 M pyrenecarboxylic acid in a 0.1 KOH solution. Stirring was continued for 3 days to modify the surface functional groups of the silicon electrode into carboxylic acid groups (primary modification). Then, the surface-modified silicon electrode was dipped in 0.1 Methylenediamine with stirring for one day to modify the carboxylic acid groups present on the surface of the carbon nanotubes into amino ($—NH_2$) groups (secondary modification).

5-(2): Surface Modification of Photovoltaic Material 0.05 g of CdO, 0.024 g of tetradecylphosphonic acid (TDPA) and 3.7 g of trioctylphosphine oxide (TOPO) were heated to 280° C. in an argon (Ar) atmosphere, and then a solution of Se in tributylphosphine (TBP) and trioctylphosphine (TOP) was added thereto. The mixture was allowed to react to synthesize CdSe quantum dots (Q-dots). After the quantum dots (0.1 M) were dissolved in toluene, 0.01 M 3-mercaptopropionic acid (3-MPA) was added to the toluene solution. The mixture was refluxed at 110° C. for 12 hr. Then, the reaction solution was centrifuged and washed with $CHCl_3$ solution. The collected powder was dissolved in a buffer solution (pH 7) to modify the ligands of the CdSe quantum dots into carboxylic acid groups.

5-(3): Application of the Photovoltaic Material to the Surface of the Carbon Nanotubes The surface-modified silicon electrode produced in Example 5-(1) was dipped in the solution of the surface-modified quantum dots, which was prepared in Example 5-(2), for one day to apply the CdSe quantum dots to the surface of the carbon nanotubes.

5-(4): Fabrication of Solar Cells

Platinum was coated on the surface of an ITO-coated conductive transparent glass substrate to produce a counter electrode as an anode. Subsequently, the counter electrode was assembled with the silicon electrode produced in Example 5-(3). Polymer films (SURLYN, DuPont) having a thickness of about 40 μm were interposed between the two electrodes. The resulting structure was pressed under heating to fabricate a sandwich type device. Then, a $LiI^-/I_3^-$ electrolyte solution was filled in a space between the two electrodes through a fine hole penetrating the counter electrode to complete the fabrication of a solar cell.

Test Example 1

Measurements of SEM Images of Wafers

Figure 4:
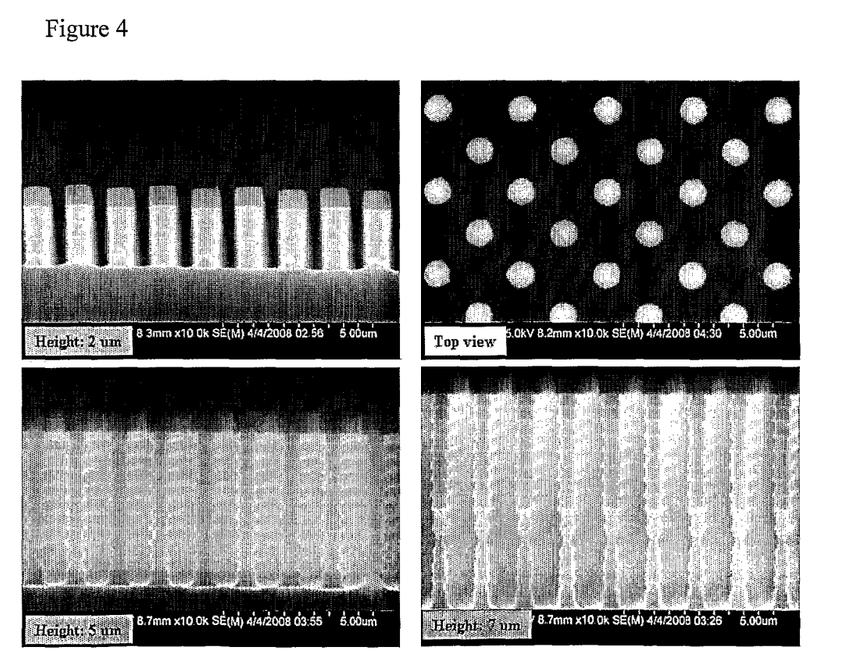
FIG. 4 shows scanning electron microscopy (SEM) images of nanorods of Si wafers, which were formed in Examples 1 to 3.

SEM images of the nanorods of the Si wafers formed in Examples 1-3 are shown in FIG. 4. It can be confirmed from FIG. 4 that the nanorods were regularly aligned.

Test Example 2

Figure 5:
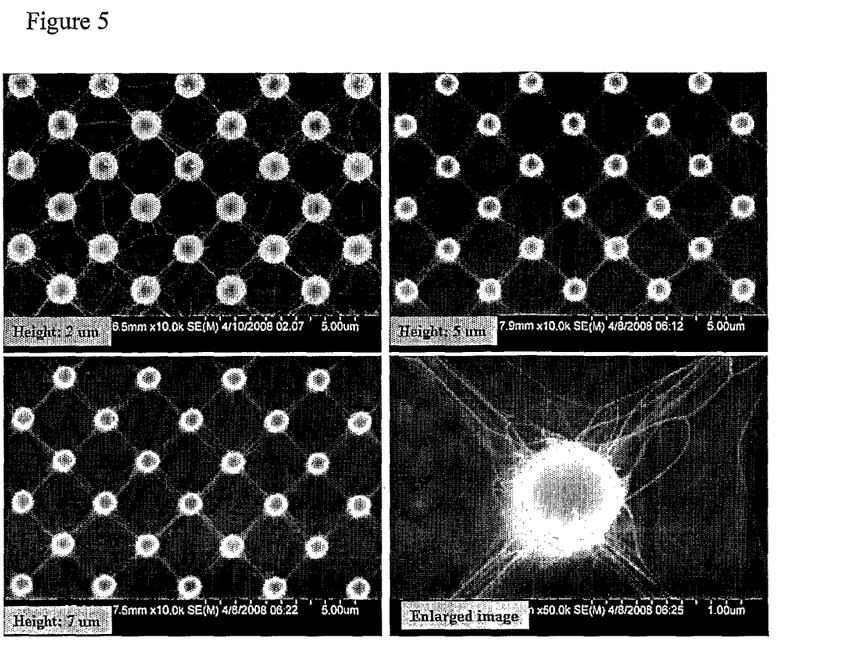
FIG. 5 shows top views of SEM images of organic/inorganic composites, which were prepared in Examples 1 to 3, and an enlarged image of one of the SEM images.
Figure 6:
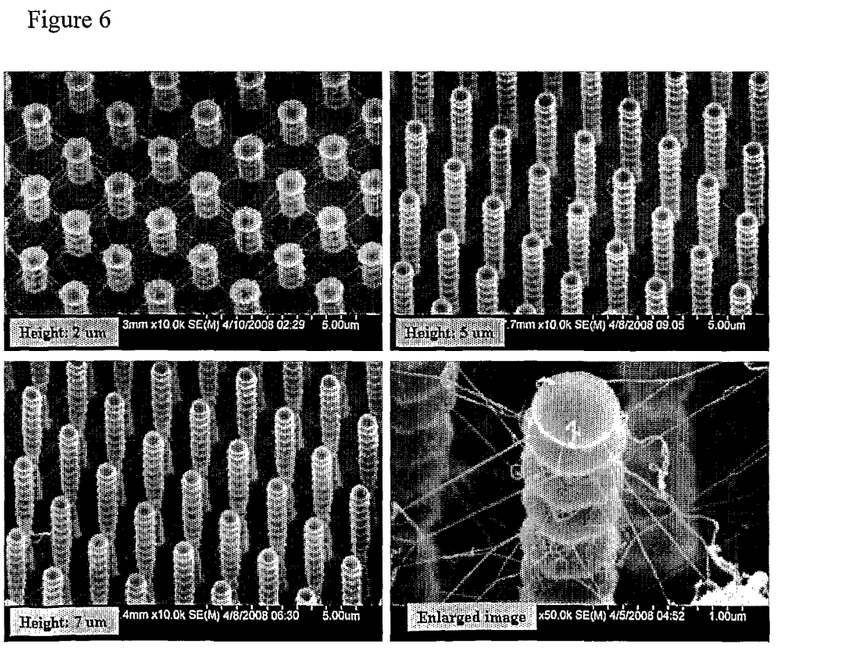
FIG. 6 shows oblique views of SEM images of organic/inorganic composites, which were prepared in Examples 1 to 3, and an enlarged image of one of the SEM images.
Figure 7:
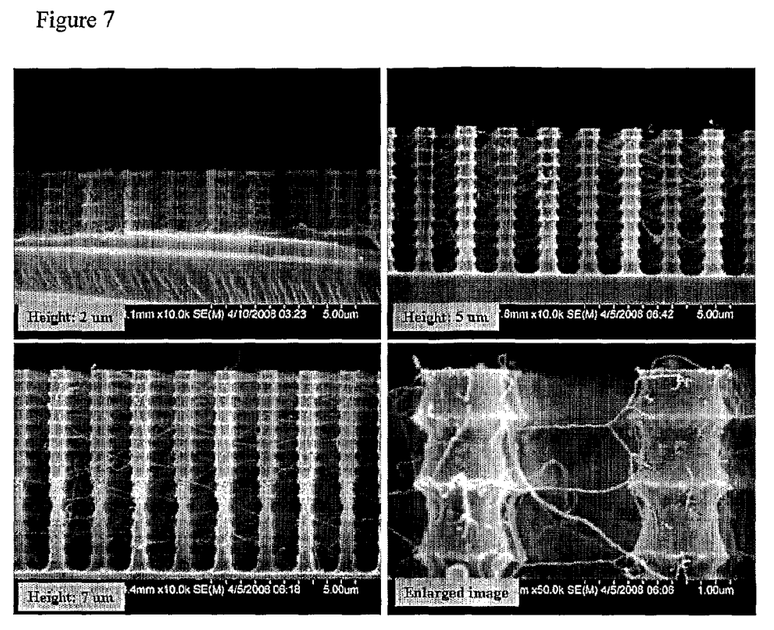
FIG. 7 shows side views of SEM images of organic/inorganic composites, which were prepared in Examples 1 to 3, and an enlarged image of one of the SEM images.

Measurements of SEM and Tem Images of Three-Dimensional Carbon Nanotube Networks Top views, oblique views and side views of SEM images of the organic/inorganic composites prepared in Examples 1-3 are shown in FIGS. 5, 6 and 7, respectively. An enlarged image of one of the SEM images is shown in each of FIGS. 5, 6 and 7.

Figure 8:
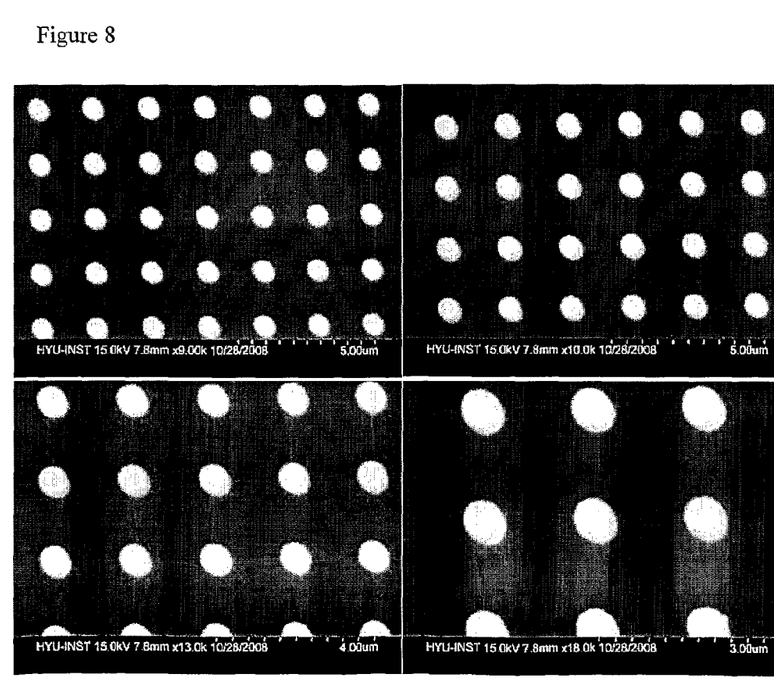
FIG. 8 shows top views of SEM images of an organic/inorganic composite, which was prepared in Comparative Example 1, taken at different magnifications.
Figure 9:
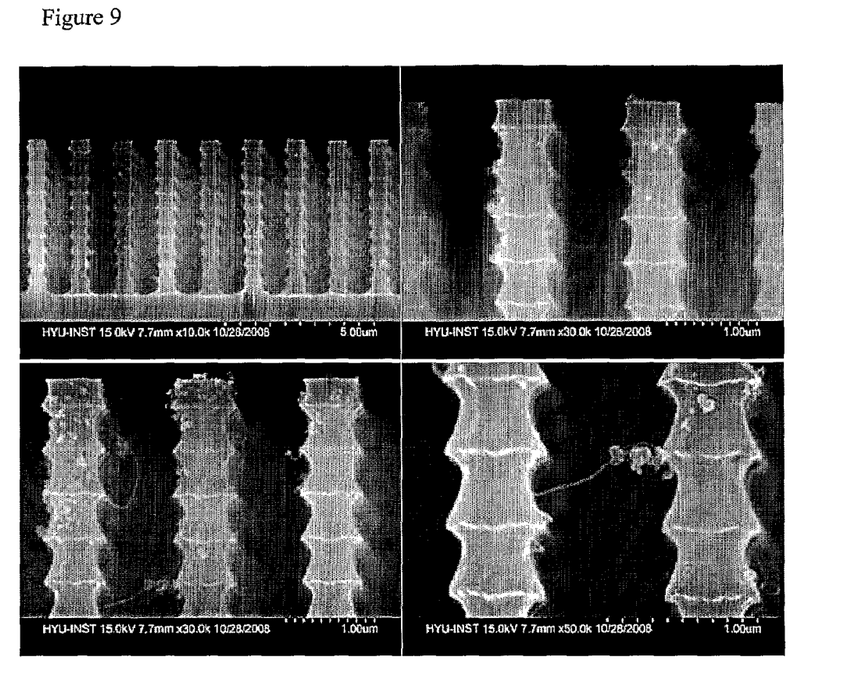
FIG. 9 shows side views of SEM images of an organic/inorganic composite, which was prepared in Comparative Example 1, taken at different magnifications.
Figure 10:
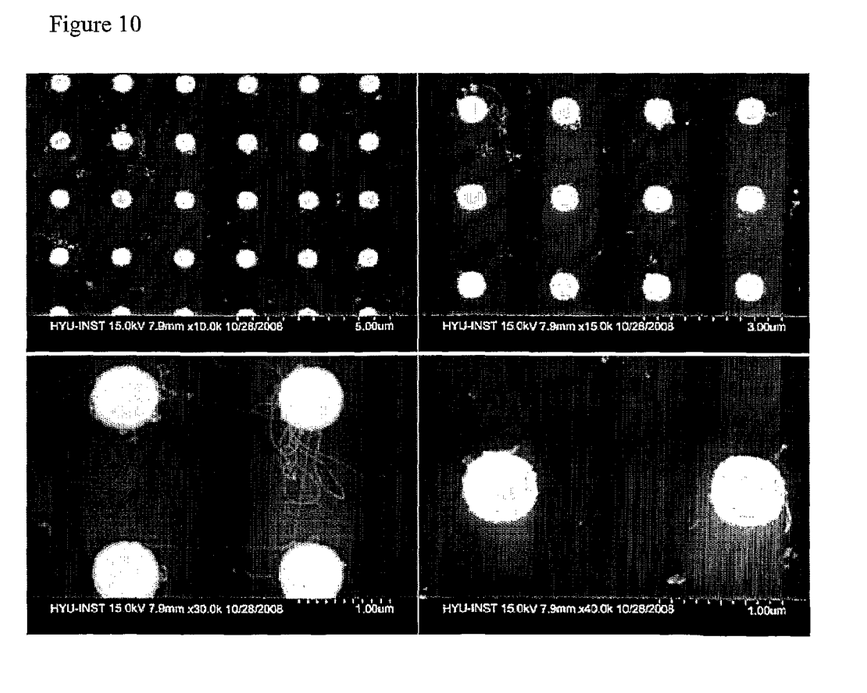
FIG. 10 shows top views of SEM images of an organic/inorganic composite, which was prepared in Comparative Example 2, taken at different magnifications.
Figure 11:
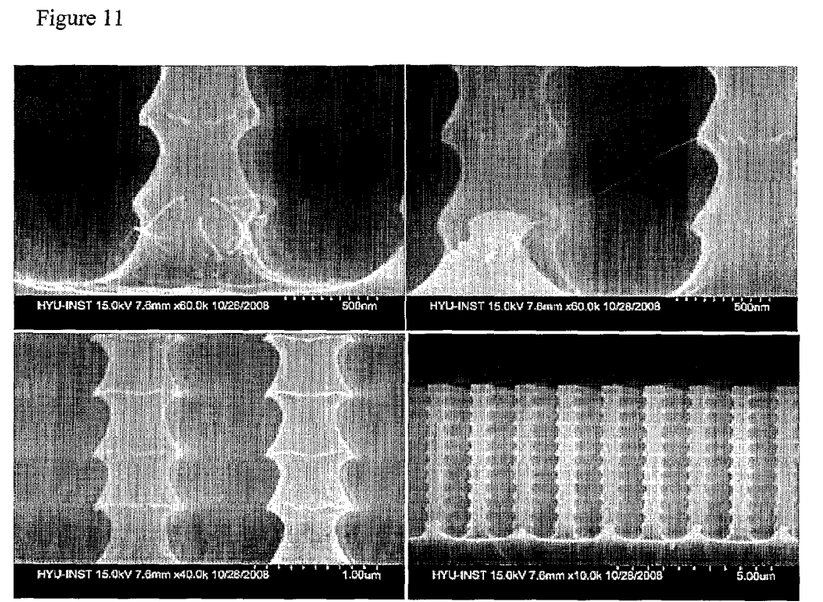
FIG. 11 shows side views of SEM images of an organic/inorganic composite, which was prepared in Comparative Example 2, taken at different magnifications.

Top views and side views of SEM images of the organic/inorganic composite prepared in Comparative Example 1 were taken at different magnifications (FIGS. 8 and 9). Top views and side views of SEM images of the organic/inorganic composite prepared in Comparative Example 2 were taken at different magnifications (FIGS. 10 and 11).

Figure 12:
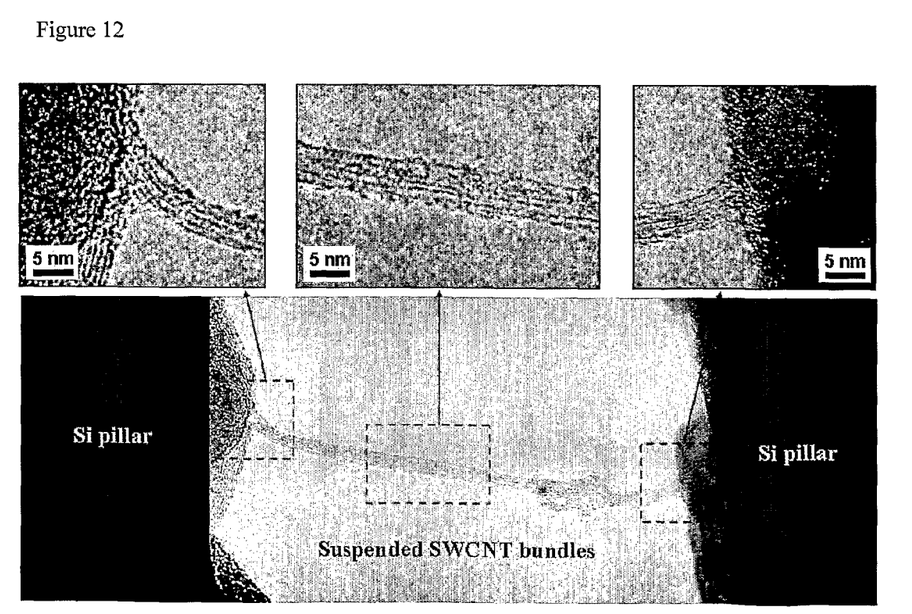
FIG. 12 shows transmission electron microscopy (TEM) images of junctions between Si nanorods and carbon nanotubes of an organic/inorganic composite, which was prepared in Example 1.

Referring to FIGS. 5, 6 and 7, the three-dimensional carbon nanotube networks were very uniformly formed between the lowest portions of the nanorods. In contrast, FIGS. 8 through 11 show that few carbon nanotube networks were formed or the carbon nanotube networks were formed at a very low density between the adjacent nanorods of the organic/inorganic composites prepared in Comparative Examples 1 and 2. From these observations, it can be known that the use of the Fe—Mo catalyst solution contributed to the formation of three-dimensional carbon nanotube networks in high density. On the other hand, transmission electron microscopy (TEM) images of the junctions between the Si nanorods and the carbon nanotubes of the organic/inorganic composite prepared in Example 1 are shown in FIG. 12. The images of FIG. 12 show that all the carbon nanotubes were directly connected to the adjacent Si nanorods.

Test Example 3

Measurements of SEM Images of Three-Dimensional Carbon Nanotube Networks

Figure 13:
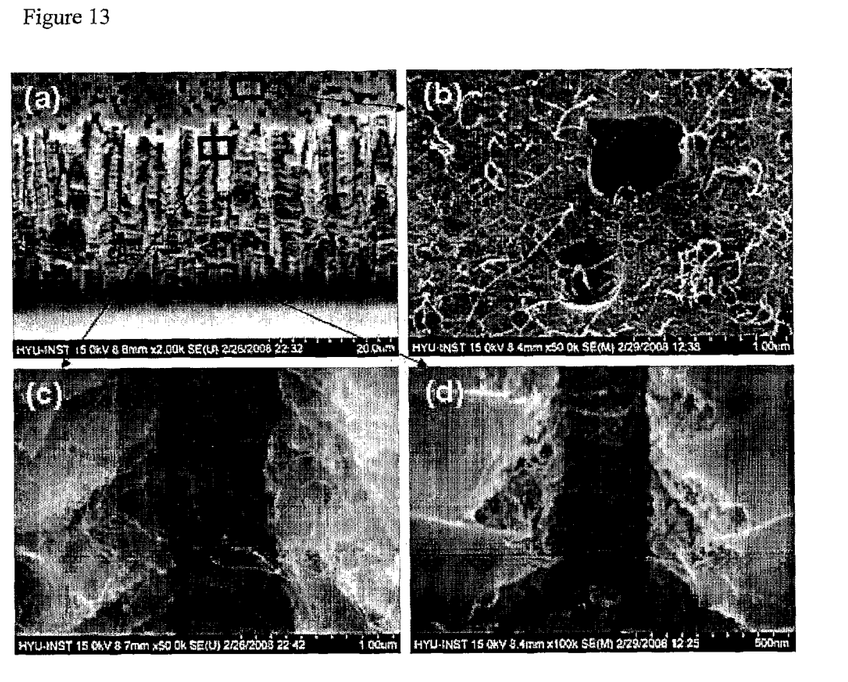
FIG. 13 shows an oblique view of a SEM image of an organic/inorganic composite, which was prepared in Example 4, and enlarged views of the SEM image.

FIG. 13 shows an oblique view of a SEM image of the organic/inorganic composite prepared in Example 4 and enlarged views of the SEM image. Referring to FIG. 13, the three-dimensional carbon nanotube networks were very uniformly formed at the surface of the nanohole (3b) as well as inside the nanoholes (3c and 3d).

Test Example 4

Figure 14:
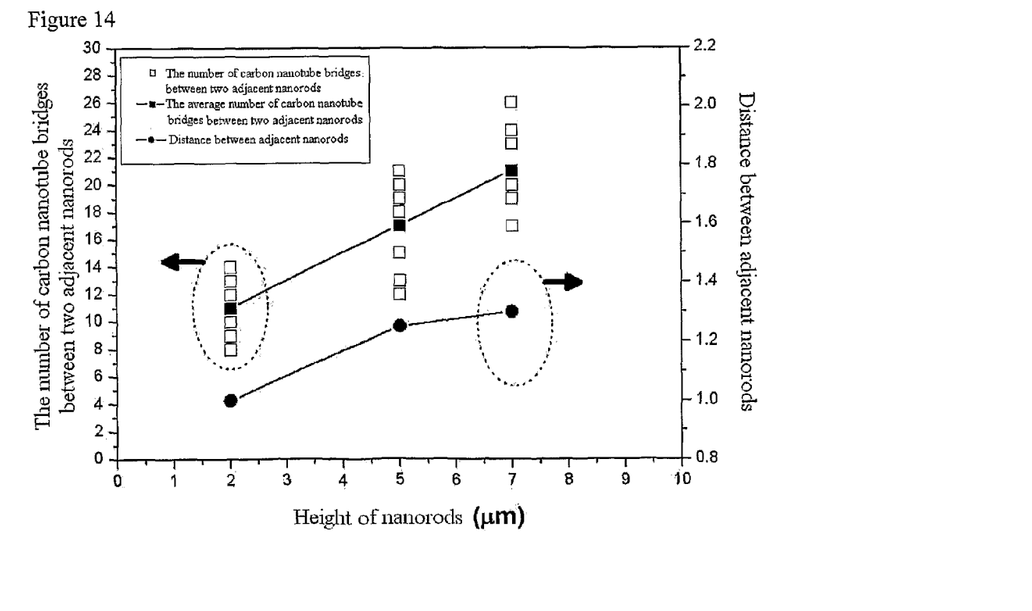
FIG. 14 is a graph showing the average numbers of three-dimensional carbon nanotube bridges formed between two adjacent nanorods of organic/inorganic composites, which were prepared in Examples 1 to 3, based on the SEM images of FIGS. 4 through 7.

Determinations of Average Numbers of Three-Dimensional Carbon Nanotube Bridges Between the Nanorods The numbers of the three-dimensional carbon nanotube bridges formed between the two adjacent nanorods of the organic/inorganic composites prepared in Examples 1-3 were counted based on the corresponding SEM images, and then were averaged. The results are shown in FIG. 14. The average numbers of the three-dimensional carbon nanotube bridges determined in Examples 1-3 were 11, 17 and 21, respectively. That is, the average number of the carbon nanotube bridges formed between the two adjacent nanorods tended to increase with increasing height of the nanorods.

Test Example 5

Measurements of Raman Spectra

Figure 15:
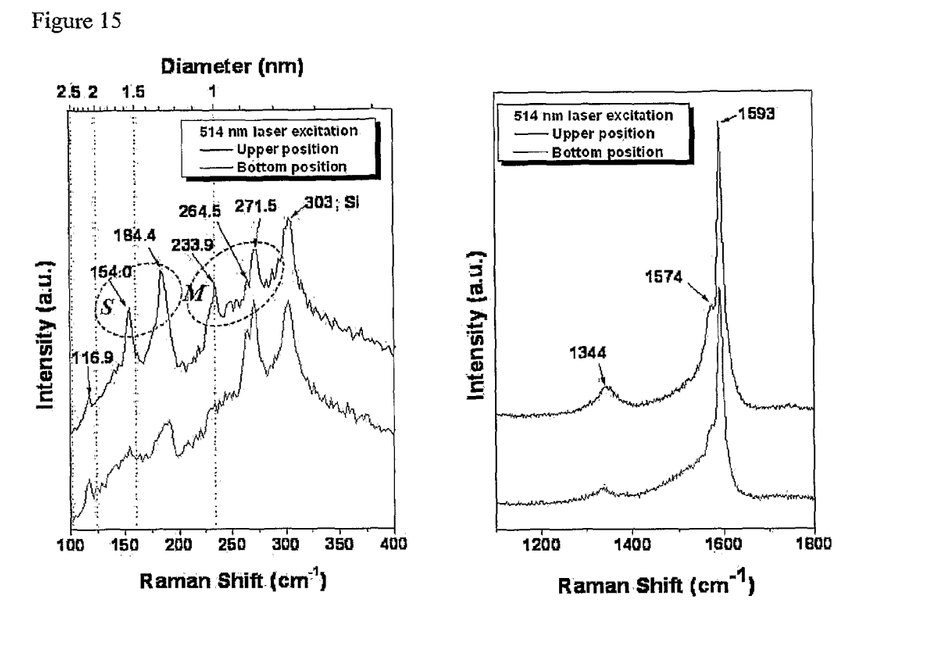
FIG. 15 shows Raman spectra (514 nm) of three-dimensional carbon nanotube networks formed in Example 1.

FIG. 15 shows Raman spectra (514 nm) of the three-dimensional carbon nanotube networks formed in Example 1. The diameter of the carbon nanotubes was calculated using the following correlation: $d^{0.93}$ (nm)=238/$v_{RBM}$ (cm$^-$) where vRBM is radial breathing mode (RBM) frequency and d is the diameter of the carbon nanotubes. Referring to FIG. 15, RBMs are observed at about 100-300 cm$^{-1}$, weak D-band is observed at 1,330-1,334 cm$^{-1}$, BWF-band is observed at 1,523-1,574 cm$^{-1}$, and sharp G-band is observed at 1,588-1,592 cm$^{-1}$. From these observations, it can be concluded that the uniform single-walled carbon nanotubes were three-dimensionally formed over the whole space between the nanorod structures. The carbon nanotubes were determined to have a diameter ranging from about 0.8 to about 1.1 nm.

Test Example 6

Performance Test of the Solar Cells

Figure 16:
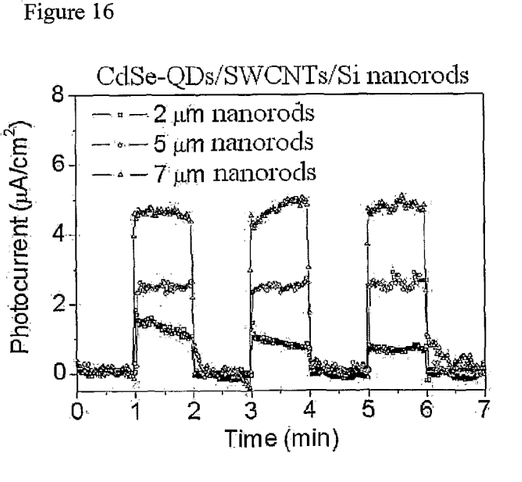
FIG. 16 is a graph showing the photocurrent characteristics of solar cells fabricated in Example 5.

The photocurrent characteristics of the solar cells fabricated in Example 5 were measured and the results are shown in FIG. 16. White light (100 mW/cm$^2$:1 Sun) was used as a light source. Referring to FIG. 16, a photocurrent density of 1-1.5 µA/cm$^2$ was measured in the solar cell using the substrate formed with the 2 µm high nanorods, a photocurrent density of 2.2-3 µA/cm$^2$ in the solar cell using the substrate formed with the 5 µm high nanorods, and a photocurrent density of 4.2-5.5 µA/cm$^2$ in the solar cell using the substrate formed with the 7 µm high nanorods. That is, the photocurrent densities of the solar cells tended to increase with increasing height of the nanorods. These results are completely consistent with the conclusion obtained in Test Example 4, i.e. the tendency that the average number of the carbon nanotube bridges formed between the two adjacent nanorods increased with increasing height of the nanorods.

The invention claimed is:

1. A method for preparing an organic/inorganic composite, the method comprising:
    (a) preparing an n-type silicon wafer having a plurality of nanorods or a plurality of nanoholes formed in a surface of the n-type silicon wafer, wherein the nanorods have a height of 2 to 200 µm, an aspect ratio of 2 to 100 and are spaced apart from each other at intervals of 50 to 2,000 nm, and wherein the nanoholes have a height of 2 to 200 µm, an aspect ratio of 2 to 100 and are spaced apart from each other at intervals of 50 to 2,000 nm;
    (b) preparing a Fe—Mo catalyst solution;
    (c) modifying outer wall surfaces of the nanorods or inner wall surfaces of the nanoholes into Si—OH to form a surface-modified n-type silicon wafer, using piranha solution, UV-ozone or oxygen plasma;
    (d) adsorbing the Fe—Mo catalyst solution on the entire outer wall surfaces of the nanorods or the entire inner wall surfaces of the nanoholes of the surface-modified n-type silicon wafer to form a catalyst-absorbed n-type silicon wafer, by dipping the surface-modified n-type wafer in the Fe—Mo catalyst solution;
    (e) reducing the Fe—Mo catalyst solution of the catalyst-absorbed n-type silicon wafer into metal catalyst to form a metal catalyst-adsorbed n-type silicon wafer, by annealing the catalyst-absorbed n-type silicon wafer while supplying ammonia (NH$_3$) or hydrogen (H$_2$) gas; and
    (f) supplying a carbon source gas to the metal catalyst-adsorbed n-type silicon wafer to grow carbon nanotubes on the entire outer walls of the nanorods or on the entire inner walls of the nanoholes of the metal catalyst-adsorbed n-type silicon wafer to form a plurality of carbon nanotube bridges between two adjacent nanorods or horizontally inside the nanoholes to thereby form a three-dimensional carbon nanotube network structure between the nanorods or inside the nanoholes.

2. The method of claim 1, wherein the Fe—Mo catalyst solution contains Fe(NO$_3$)$_3$.9H$_2$O and an aqueous solution of molybdenum (Mo).

3. The method of claim 1, wherein the molar concentration ratio of Fe to Mo in the Fe—Mo catalyst solution is between 5:1 and 0.5:1.

4. The method of claim 1, wherein sonication is performed in the dipping step.

5. The method of claim 1, wherein the carbon source gas is selected from the group consisting of methane, ethylene, acetylene, benzene, hexane, ethanol, methanol, propanol gases, and mixed gases thereof.

* * * * *